United States Patent [19]

Carre et al.

[11] Patent Number: 5,535,173

[45] Date of Patent: Jul. 9, 1996

[54] DATA-STORAGE DEVICE

[75] Inventors: Laurent Carre, Voreppe; Patrick Correard, Poisat, both of France

[73] Assignee: SGS-Thomson Microelectronics S.A., Saint-Genis Pouilly, France

[21] Appl. No.: 277,259

[22] Filed: Jul. 19, 1994

[30] Foreign Application Priority Data

Jul. 19, 1993 [FR] France .................... 93 08832

[51] Int. Cl.$^6$ ............... G11C 8/00; H04N 7/167
[52] U.S. Cl. ............... 365/230.09; 365/230.01; 395/421.02; 395/421.04; 395/421.07; 395/421.08; 395/421.10
[58] Field of Search .............. 365/230.01, 230.03, 365/230.09, 238.5, 239, 240; 395/400, 425, 421.02, 421.04, 421.07, 421.08, 421.10

[56] References Cited

U.S. PATENT DOCUMENTS

| 5,191,609 | 3/1993 | Mau | 380/14 |
| 5,276,826 | 1/1994 | Rau et al. | 395/400 |

*Primary Examiner*—Viet Q. Nguyen
*Attorney, Agent, or Firm*—David M. Driscoll; James H. Morris

[57] ABSTRACT

To resolve problems associated with the use of an AUDIO type memory with defective cells without concern for groups of defective cells in such memories, the sounds to be recorded are stored at random addresses, or rather pseudo-random addresses, in the memory. It is shown that, by storing the sounds in this way, it is possible, during the reading operation, by following a same pseudo-random sequence, to restore a coherent sound. At the same time, the device is not demanding in regard to the quality of the memories used.

36 Claims, 3 Drawing Sheets

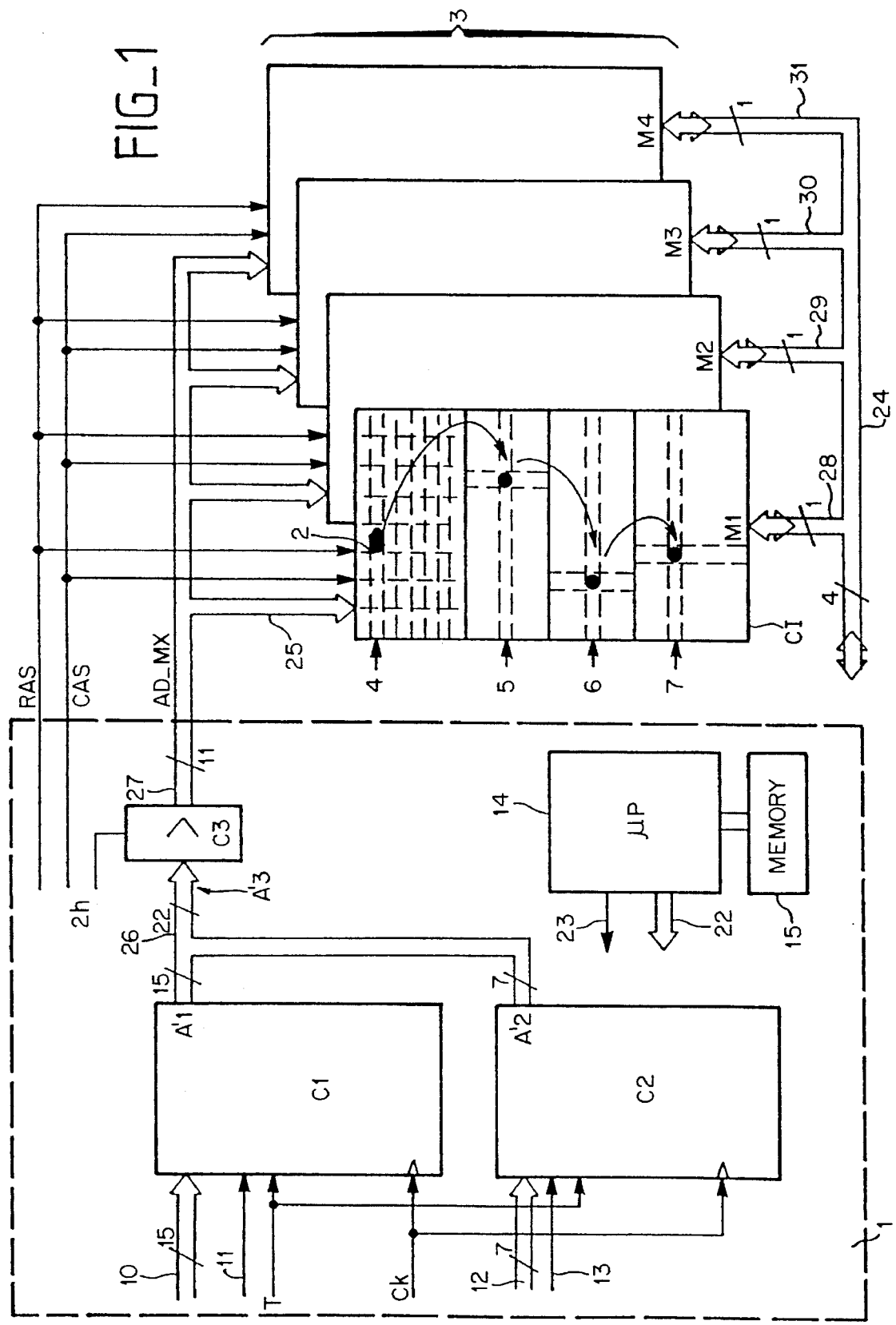
FIG_1

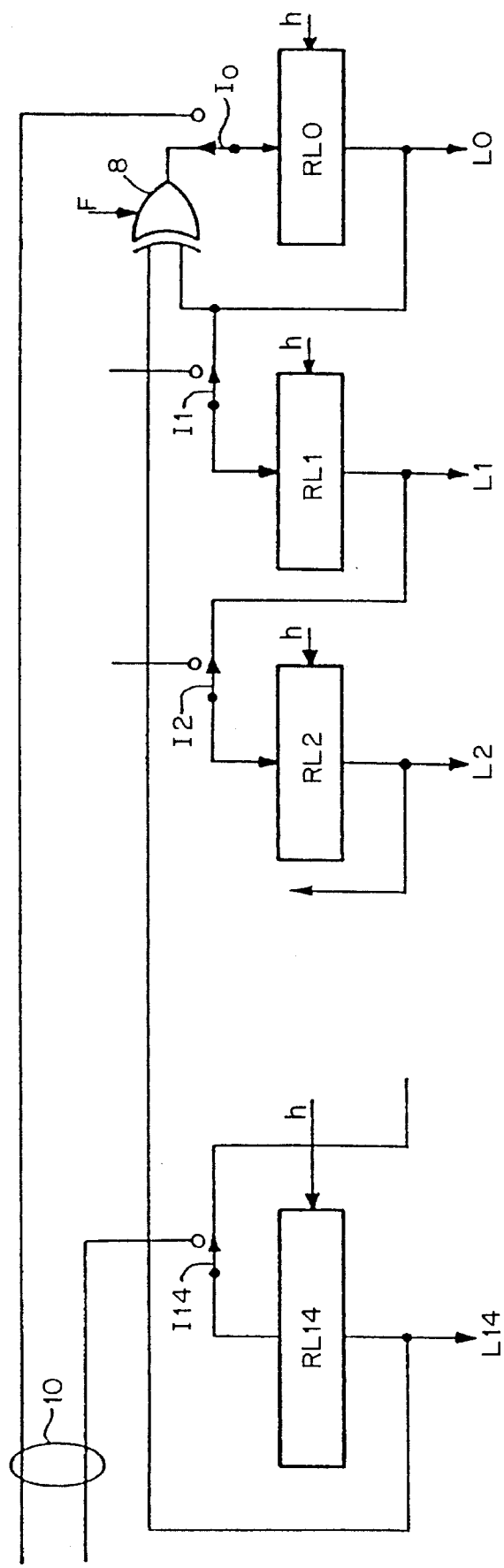
FIG_2a
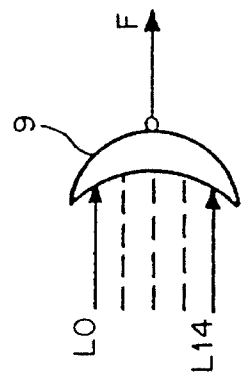
FIG_2b

FIG_3
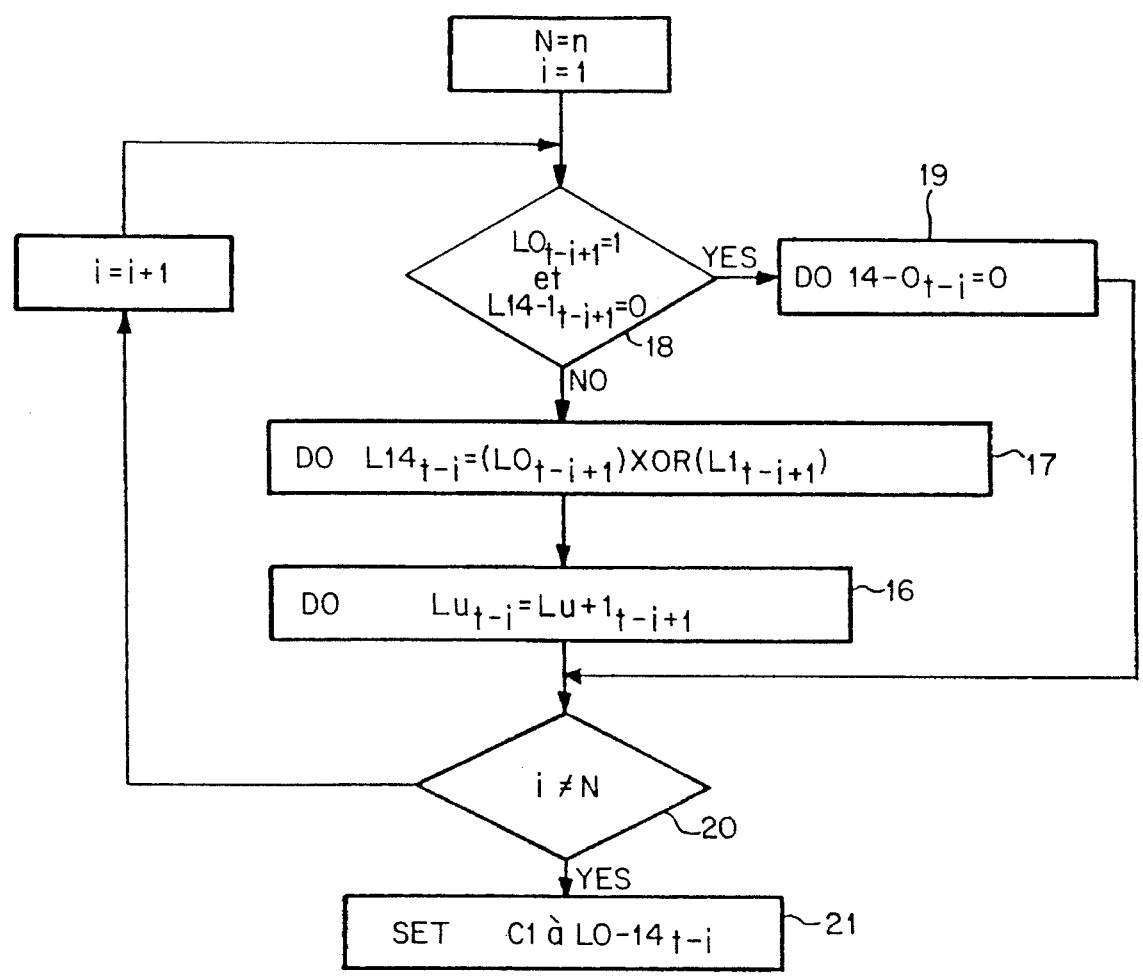
FIG_4
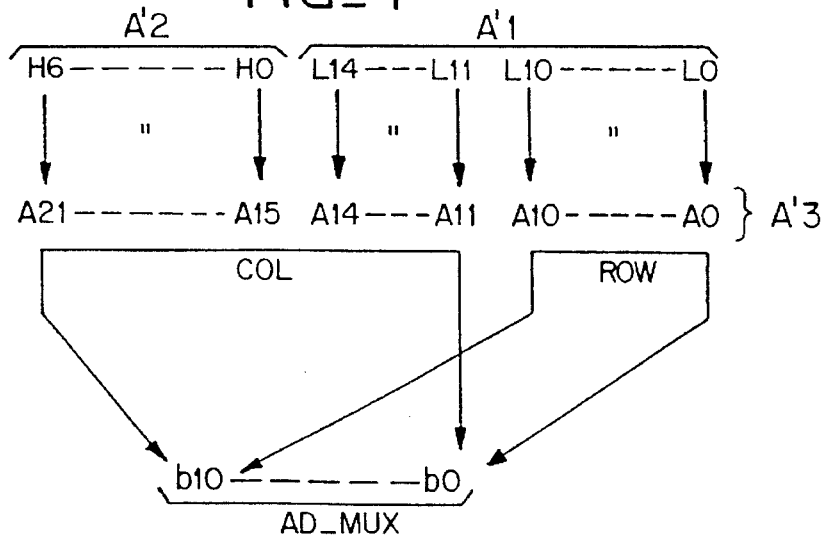

DATA-STORAGE DEVICE

BACKGROUND OF THE INVENTION

1. Field of the Invention

The present invention relates to a device for the storage of data elements, in particular, to the storage of so-called AUDIO-type data elements whose nature is such that, from time to time, they can tolerate storage defects without causing highly perceptible errors during use, notably when they are heard. The device may also be used for the storage of image data elements, notably when they are compressed. Within this disclosure, therefore, the term AUDIO is more generally used to designate audio, video, and other types of data elements. In order to reduce the cost of storage of these AUDIO information elements, it is desired to use AUDIO-type static or dynamic electronic memories, that is, memories that contain defective memory cells.

For such a structure to be possible, the error rate should not exceed a certain maximum value and, furthermore, errors should be presented so that they are evenly distributed during the re-utilization, i.e., during the retransmission, of the AUDIO signal. In a known way, to limit the possible consequences of these defects, an error detection and correction code can be added to the digital information elements representing the AUDIO signal. Error detection and correction codes are fairly efficient for isolated defects, and are of a known type. They necessitate the implementation of error-correction algorithms.

2. Discussion of the Related Art

Two constraints arise when it is sought to use AUDIO-type memories. The first constraint is not to exceed a given error rate (TMAX) in the memory. Second, the defects must be uniformly distributed in a memory map of the memory. AUDIO-type random-access memories (RAMs) include two types of defects. First, they include defective memory cells that are isolated. Second, they include defective memory cells that are grouped together. Defects of the latter type are present notably when there are defective memory rows or columns. It can be seen that the latter type of defect is not compatible with the second constraint referred to above. The choice of AUDIO memories should thus be limited to those whose rate of isolated defective memory cells is lower than TMAX and whose rate of grouped defective memory cells is zero. The drawback of this situation is that it is necessary to sort out the audio memories to find out which memories can be used. Furthermore, certain memories are rejected at the end of the sorting operation A known method for resolving this problem is to check the state of the memory and of the cells to be addressed before power is turned on and before the data elements are written. When defects are observed, a table of the defects is prepared. This table is saved, and the addresses intended for the defective memory cells are rerouted to redundant memory cells. This method has the drawback firstly of being complicated and, secondly, of prompting a loss of time during use. A result of a use such as this is also that the rate of use of the memory is no more than 100% and that the mean bit rate of the memory is slower. The drawback of these prior art techniques is that the development of an application with memories such as these depends on a so-called "zero defect" quality of the memories used.

SUMMARY OF THE INVENTION

One object of the invention is to remove all these constraints and create circuits for the storage of data elements in poor-quality AUDIO memories without the need to specifically determine the exact quality of these memories. In the invention, it is enough only to know an error rate T given by the manufacturer of the AUDIO memory and to ascertain that it is lower than a maximum value, TMAX. In practice, these AUDIO memories are dynamic memories, but they can also be static or even non-volatile memories, provided that they are random-access memories.

In the invention, to resolve the problem thus presented, advantageous use is made of the fact that the AUDIO data elements replayed (i.e. sent out to loudspeakers) are successively coherent with one another. During a writing operation to memory, successive data elements that correspond to successive sounds are distributed randomly or pseudo-randomly at different locations in the memory. During a reading operation from memory, the successive elements of stored AUDIO data are re-read according to the same pseudo-random sequence. In view of the random character of the storage, defects that are grouped together are then removed without difficulty.

During reading, i.e. when the data elements are being heard, the defects, even when they are in groups, are experienced as being uniformly distributed in the memory map. It is then possible to use memories having an error rate that is lower than the maximum rate tolerated, without any concern for whether the errors are isolated or grouped.

Furthermore, the data elements are written and read sequentially beginning at a prescribed starting address, the other addresses being determined, on the whole, by a generator of pseudo-random codes. After an initialization of the generator of pseudo-random codes to a starting value, the system automatically generates successive addresses. The writing and the reading of memory therefore follow a predetermined sequence. To avoid a repetitive sequential character of the access to the data elements, which is sometimes irksome, the generator of pseudo-random codes is provided with presetting or setting inputs that can be used to preset any value and thus prompt a starting of a sequence of at least a reading or writing operation at any planned location.

To facilitate the management of information in the memory maps of electronic memories, whether they are AUDIO or other memories, memory maps are generally divided into sectors. If all the memory words of a sector are replayed before going on to a next sector, then the most immediate implementation of the sectorization of a memory map in the context of the invention leads to the choosing, for each sector, of a maximum rate of errors equal to the total rate of errors of the memory divided by the number of sectors. There is a risk then that the actual rate of errors in a sector might be too high, and that the memory could not be used, even though the total error rate for the memory as a whole is within TMAX.

In the invention, to resolve this additional problem, the idea arose of changing the sector for each new pseudo-random address created by the generator. In a preferred embodiment, this change of sector is itself neither random nor pseudo-random, but is gradual, modulo the number of sectors. Under these conditions, the error rate encountered during replay remains the one given by the manufacturer, and the addressing remains simple. In this case, an address is composed of a first part corresponding to the sector number and a second part that is completely pseudo-random.

There remains yet another problem, related to the size of the memory words to be stored. It is observed that, in instances of certain manufacturing problems, defective cells in the memory map are found to be contiguous. Under these conditions, if a whole word is written in a group of contiguous cells at each access, then the pseudo-random addressing device becomes inefficient. There is a risk of creating packets of, for example, four bad bits when four-bit words are involved. Furthermore, if cycles of reading/modification/writing are used to write only one bit at a time, then the gain in the time of access to the information is lost.

To resolve this other problem, according to the invention, an assumption is made that there is no correlation of defects between different memory packs. A composite memory map with a data bus comprising several bits (for example four bits) is physically composed of a parallel connection of several one-bit memory pack circuits (for example, four). Parallel access is then obtained, even simultaneously, to single memory cells located at the same pseudo-random addresses in each of the memory pack circuits. Each memory pack circuit then delivers a one-bit information element on a wire, thus forming one wire of a four-wire data bus of the set of memory pack circuits.

An object of the invention is therefore to provide a device for the storage of successive data elements in memory words of a random-access memory wherein the device comprises a generator of pseudo-random addresses to distribute successive data elements to pseudo-random addresses in the memory.

BRIEF DESCRIPTION OF THE DRAWINGS

The foregoing, and other objects and advantages, will be understood more clearly from the following detailed description and from the accompanying figures. This description is given by way of example only and in no way restricts the scope of the invention. In the figures:

FIG. 1 shows a memory according to the invention;

FIGS. 2a and 2b show an exemplary embodiment of a pseudo-random generator according to the invention;

FIG. 3 is a flowchart pertaining to the use of the pseudo-random generator in reverse mode;

FIG. 4 shows a particular feature of an embodiment of the circuit of the invention for dynamic type memory integrated circuits.

DETAILED DESCRIPTION

FIG. 1 shows a device 1 for the storage of successive data elements in memory words 2 of a random-access memory 3. According to the invention, the storage device has a generator of pseudo-random addresses C1, C2, and C3 to distribute successive data elements to successive pseudo-random addresses 4, 5, 6, 7 etc. FIG. 2 shows an exemplary embodiment of a pseudo-random generator such as this. However, this may be any generator, and, in particular, it may be a generator of the type described in the work by Miron ABRAMOVICI, Melvin A. BREUER and Arthur D. FRIEDMAN, "Digital Systems Testing And Testable Design", Computer Science Press, 1990, pp. 432 to 441.

According to a preferred embodiment of the invention, the generator of pseudo-random addresses has a first circuit C1 to successively deliver the P-bit pseudo-random binary words representing first parts of an address signal. In one example, P=15. The generator also has a second circuit C2 for the synchronized delivery of contiguous Q-bit binary words. In one example Q is equal to 7. These binary words are respectively available at the outputs A'1 and A'2 of the circuits C1 and C2 on P-bit and Q-bit buses joined together to form a (Q+P) bit bus A'3.

The circuits C1 and C2 operate as follows. Starting from an initial state, an incrementation signal T is applied to both circuits C1 and C2. The transmission of this signal is synchronized by a triggering of the circuits C1 and C2 by a clock signal CK, which acts as a validation signal. The incrementation signal T is quite simply a pulse signal. The circuit C1 delivers a periodic pseudo-random signal consisting of $2^P$ different binary states. For each period, the circuit C1 reproduces the same pseudo-random steps.

FIG. 2a shows an exemplary constitution of the circuit C1. This circuit is formed by a set of 15 registers RL0 to RL14 that are cascaded together to form a shift register. The output of the register RL0 is connected to the input of the register RL1. The output of the register RL1 is connected to the input of the register of the register RL2, and so on. The output of the register RL14 as well as the output of the register RL0 are applied to the two inputs of an exclusive-or gate XOR, 8, the output of which is applied to the input of the register RL0. The outputs of the registers RL0 to RL14 let through address signals L0 to L14. All these registers are triggered by a signal h, which results from the validation of the signal T by the clock signal CK.

Normally, a generator of pseudo-random states such as this, with P outputs, is capable of producing only $2^{P-1}$ different states. Indeed, the state 000 . . . 000, or in certain cases the state 111 . . . 111, is not capable of triggering the operation of the generator. These binary states are called "wells" because they block the evolution of the generator. These wells are detected and decoded in the invention. The result of this decoding is used to set the circuit C1 to a known state. In one example, the decoding circuit quite simply has a NOR gate 9 which receives the signals L0 to L14. When all these signals are at zero, the NOR gate 9 produces a signal F for setting the state 1. The signal F is applied to the XOR gate 8 and sets the output of this gate 8 to the state 1. Consequently, at the next pulse h, the signal L0 which was at zero like all the signals L0 to L14, is taken to 1. Under these conditions, the generation of the pseudo-random codes can start again. At the end of $2^{P-1}$ steps, a microprocessor 14 must reload C1 to put it in the "all at zero" state.

The circuit C2 is preferably realized as a counter, in this case a counter by 128 that has seven outputs and that progresses gradually by one point at each step. It is easy to foresee the progress of the outputs of the circuits C2.

For the circuit C1, FIG. 2a shows a battery of change-over switches I0 to I14 interposed between the outputs of the shift registers and the inputs of the following shift registers. These change-over switches I0 to I14 enable the inputs of the registers RL0 to RL14 to be linked to the fifteen wires of an input bus 10 for setting or presetting states. A control signal for the change-over switches I0 to I14 is applied to an input 11 of the circuit C1. For the circuit C2, the counter can be connected to the seven wires of a bus 12 when a command is applied to a control wire 13 of the counter C2. When this command is applied, the binary state at the buses 10 and 12 is applied to the inputs of the registers RL0 to RL14 and to the setting inputs of the counter C2. Once these loading operations have been carried out, at the next pulse h, these setting or presetting states are available at the bus 26 at output of the circuits C1 and C2.

It sometimes happens, in the recording of the AUDIO signals, that periods of silence have to be recorded. Rather than taking up a substantial portion of the memory to store such periods of silence, it is preferred to measure their duration and, according to a suitable protocol, to record an encoded word corresponding to the duration of silence. A problem to be resolved then is that of detecting, at an instant t, that a silence has occurred with a duration n, which had begun at a time t−n. Further, it is sought to make a recording from the address corresponding to a time t−n+1. It is desired to record an encoded word (preferably with an adapted error code) from the address corresponding to the time t−n+1.

The problem then is to return to the perfectly deterministic pseudo-random address corresponding to the time t−n+1. What is known at the instant t is, firstly, the number n of steps taken and, secondly, the state of the outputs of the circuits C1 and C2 at the instant t. It is desired to know the state of the outputs at the instant t−n+1.

To determine the state of the outputs of the circuit C2 at the instant t−n+1, a simple subtraction is performed modulo 128 of the state at the time t minus the value n of steps taken. However, determining the output of the circuit C1 at time t−n+1 is not so simple, as circuit C1, would have to be made to work in reverse, which is impossible. In the invention, this problem is solved by using the microprocessor 14 that is capable of running a program contained in a memory 15 aimed at setting the outputs of the circuit C1 to a previous state. The program contained in the memory 15 makes it possible to determine this state and to apply it to the output of the circuit C1 according to the mode described hereinabove using the bus 10 and the command 11.

FIG. 3 is a flowchart of the actions that the microprocessor 14 must be made to carry out for this purpose. At each reverse counting step, given the fact that a shift register is involved, it is necessary in an instruction 16 to compute the theoretical output of a register RL at the instant t−1 by making it equal to the output of a register RL u+1 at the instant t−i+1. This is valid for all the registers except the last one. Indeed, the register RL14 does not have any following register. Given the XOR function performed by the gate 8, the theoretical output of the register RL14, at the instant t−1, is computed in an instruction 17 as being equal to the result of an exclusive-or function applied to the binary signals of the outputs of the registers RL0 and RL1 at the instant t−i+1. For reasons of coherence, however, the instruction 17 is carried out before the instruction 16.

What remains to be settled now is the problem that arises when the output of the register RL0 is in the state 1 while the outputs of the other registers are in the state 0. Indeed, the state preceding this state is the "well" state which is normally not possible to leave and therefore is logically not possible to enter in reverse. Hence, in the course of a test 18 performed at each step, it is sought to detect a situation such as this. When such a situation occurs, the value of all the outputs preceding the registers RL14 to RL0 are set at zero in an instruction 19. The test 18 is of course carried out before the instruction 17. The set of instructions and tests 16 to 19 are carried out n times. To this end, an increment i with a starting value equal to 1 is used, and the implementation of this computation is stopped when i has reached the expected value.

At the end of a test 20 which determines when i has reached the expected value, an instruction 21 electrically sets the outputs of the circuit C1 to the last-calculated values L0 to L14. In practice, the microprocessor 14 activates the bus 10 of the circuit C1 by means of a data bus 22 and activates the command 11 by means of a control output 23. A similar process takes place for the circuit C2, except that the program for computing of the values to be imposed on the bus 12 is far easier, consisting of a single subtraction.

The memory 3 is linked to the outside world by a data bus 24. In one example, the bus 24 is a four-bit bus. It furthermore receives the read/write or modification addresses by means of an address bus 25 connected to the (P+Q)-wire bus 26 produced by the circuits C1 and C2. In practice, for reasons of standardization, when the memory 3 is of the dynamic type, the address bus is limited to 11 wires. In this case a multiplexing circuit C3 enables the supply, at twice normal speed, of an eleven-wire bus 27. In the memory 3, in a known way, an eleven-wire bus such as this is multiplexed to reconstitute address words with the desired number of bits, namely 22 bits. For practical reasons, the circuit 1 is a monolithic integrated circuit, into which it is deemed necessary to incorporate the multiplexer C3. The working of this multiplexer is of a known type and does not require detailed description herein. The multiplexer C3 is only controlled by a signal 2h at twice the frequency of the signal h. As a variant of this embodiment, the data bus 24 of the memory 3 as well as certain control wires CAS and RAS can be made to go through the integrated circuit 1.

In a preferred embodiment, the memory 3 is formed by a parallel connection of four memory modules M1 to M4 which are all identical, each module possessing $2^{P+Q}$=four mega-cells of memory each. The addresses prepared by the circuit 1 are applied simultaneously to the address inputs of address decoders of the four modules M1 to M4. Each of these modules is connected to a one-wire data bus. The four one-wire data buses 28 to 31 are assembled into a four-wire bus 24. As a result, it is ensured that a four-bit word is loaded for each of the four one-bit words respectively of the four memory modules M1 to M4. In this way, the need to load a four-bit memory word representing one information element into a single memory pack is avoided. Such a loading would make it difficult to restore the information element if the entire memory word in question were defective.

FIG. 4 gives a practical view of the mode of organization of the operations for addressing the memory elements M1 to M4. At the output of the circuit C1, there are fifteen signals L0 to L14. At the output of the circuit C2, there are seven signals, H0 to H6. In the bus 26, by simple juxtaposition, there are twenty-two address signals A0 to A21. Coming out of the multiplexer C3, there are alternately available, signals A0 to A10 and then signals A11 to A21. In practice, the signals A0 to A10 are applied to the row decoders of the memory elements M1 to M4, while the signals A11 to A21 are to be applied to the column decoders. Consequently, the way in which the sectors are shown in FIG. 1 corresponds to an actual implementation only in a schematic way.

Since the number $2^P$ states of the circuit C1 is greater than the number $2^Q$ states of the circuit C2, this circuit C2 is made to carry out several complete periodic rotations before the circuit C1 delivers one complete periodic rotation. In practice, the circuit C2 carries out $2^{P-Q}$ rotations for each rotation of the circuit C1. In the example referred to above, it carries out 256 rotations. At the end of all these rotations, however, there is a risk that the circuit C1 will produce a same binary state as earlier while the circuit C2 also will produce a same binary state. In this case, there would be a risk of limiting access to only $2^P$ memory words in the memory 3. To this end, the microprocessor 14 and the program memory 15 are used to implement a program that counts the number of rotations of the counter C2. At the end of $2^{P-Q}$ rotations, the circuit C2 alone is made to advance by one point and C1 is loaded into an "all at zero" state. The counting of these rotations is then started again until 256 is again obtained, and so on and so forth.

Having thus described one particular embodiment of the invention, various improvements, alterations, and modifications may occur to those skilled in the art. Such improvements, alterations, and modifications are intended to fall within the scope of the foregoing disclosure. Thus, the embodiment presented herein is provided by way of example only. The invention is limited only by the following claims and their equivalents.

What is claimed is:

1. A device for the storage of successive data elements in memory words of a random-access memory, comprising:

a generator of pseudo-random addresses including a first circuit for successively delivering pseudo-random P-bit binary words representing a first part of an address signal used to store the successive data elements, and a second circuit for successively delivering contiguous Q-bit binary words representing a second part of the address signal used to store the successive data elements;

synchronizing circuitry to synchronize a delivery of the P-bit and Q-bit binary words of the first and second circuits with the successive data elements; and a concatenation circuit to concatenate the first part and the second part of the address signal to create a pseudo-random address of P+Q bits; whereby the successive data elements are distributed pseudo-randomly within the memory.

2. The device of claim 1, wherein the memory is a dynamic memory.

3. The device according to claim 1, further comprising a computation circuit for computing a preceding pseudo-random address in response to a current address.

4. The device according to claim 1, comprising, in the memory:

an arrangement of N storage integrated circuits, each including $2^M$ memory words with a length of R bits;

the N integrated circuits each being connected by an R-wire data bus to R different wires of an N×R-wire data bus of the memory;

the N storage integrated circuits being parallel connected to an M-wire address bus.

5. The device of claim 4, wherein R is equal to 1.

6. The device according to claim 1, further comprising a computation circuit for computing a preceding pseudo-random address in response to a current address.

7. The device according to claim 1, comprising, in the memory:

an arrangement of N storage integrated circuits, each including $2^M$ memory words with a length of R bits;

the N integrated circuits each being connected by an R-wire data bus to R different wires of an N×R-wire data bus of the memory;

the N storage integrated circuits being parallel connected to an M-wire address bus.

8. The device of claim 7, wherein R is equal to 1.

9. The device of claim 1, wherein the concatenation circuit comprises a multiplexer.

10. The device of claim 1, wherein the memory is a dynamic memory.

11. The device according to claim 1, wherein the first and second circuits each includes an input for receiving a first predetermined address and each further includes means for imposing the first and second received predetermined addresses on outputs of the first and second circuits respectively. addresses.

12. The device according to claim 11, further comprising a computation circuit for determining a preceding pseudo-random address in response to a current address.

13. The device according to claim 1, wherein the first circuit has a period of $2^P$ pseudo-random binary states and the second circuit has a period of $2^Q$ binary states.

14. The device of claim 13, wherein the memory is a dynamic memory.

15. The device according to claim 14, wherein the computation circuit comprises a microprocessor and program memory, the microprocessor being coupled to the program memory to carry out a program contained in the program memory.

16. A circuit for generating a sequence of memory addresses, comprising:

a first circuit that generates a deterministic sequence of pseudo-random memory address bits;

a second circuit that generates a sequence of contiguous memory address bits; and a third circuit that concatenates the sequence of contiguous memory address bits with the sequence of pseudo-random address bits to form a combined sequence of memory addresses.

17. The circuit of claim 16, wherein the first circuit includes presetting circuitry for establishing a predetermined output of the first circuit and for establishing a starting point from which the sequence of pseudo-random address bits is generated.

18. The circuit of claim 17, further comprising a processing circuit coupled to the presetting circuitry of the first circuit that is constructed and arranged to supply a preset address to the presetting circuitry of the first circuit.

19. The circuit of claim 17, wherein the circuit includes presetting circuitry for establishing a predetermined output of the second circuit and for establishing a starting point from which the sequence of contiguous address bits are generated.

20. The circuit of claim 17, further including synchronizing means for synchronizing the first and second circuits.

21. The circuit of claim 17, wherein the first and second circuits include presetting circuitry for establishing a predetermined output of the first and second circuits and for establishing a starting point from which the combined sequence of memory address bits are generated.

22. The circuit of claim 21, further including a processing circuit coupled to the presetting circuitry, that is constructed and arranged to supply a preset address to the first and second circuits.

23. The circuit of claim 22, wherein the processing circuit includes means for counting a number of addresses generated.

24. The circuit of claim 23, wherein the processing circuit includes means for detecting a period of silence represented by an input stream of audio-type data.

25. The circuit of claim 23, wherein the processing circuit includes means for determining a memory address that occurred "n" steps previously.

26. The circuit of claim 25, wherein the means for determining the memory address that occurred "n" steps previously determines said memory address in response to a present memory address.

27. The circuit of claim 26, wherein the processing circuit includes means for presetting the first and second circuits with the memory address that occurred "n" steps previously.

28. The circuit of claim 22, wherein the processing circuit includes means for counting a number of periodic rotations of the second circuit as the second circuit incrementally outputs all contiguous address values from a first value to a last value.

29. The circuit of claim 22, wherein the processing circuit includes a microprocessor and a memory.

30. The circuit of claim 22, wherein the second circuit includes a counter that generates a sequence of consecutive binary codes.

31. The circuit of claim 22, further including a multiplexing circuit that receives the combined sequence of address bits at a first rate and generates a multiplexed sequence of address bits at a second rate.

32. A method of storing audio data in a device comprising the steps of:

selecting a memory device comprising addressable defective memory cells and having a defective memory cell error rate less than or equal to a maximum allowable error rate Tmax;

generating a deterministic sequence of pseudo-random memory address bits;

generating a sequence of contiguous memory address bits;

concatenating the sequence of pseudo-random memory address bits with the sequence of contiguous memory address bits to form a combined memory address signal; and storing the audio data in the selected memory device as addressed by the combined memory address signal.

33. A method as recited in claim 32, wherein the step of selecting includes selecting a memory device in which addressable defective memory cells occur in clusters within the memory device.

34. A method as recited in claim 32, further comprising the step of retrieving the audio data stored in the selected memory device using another combined memory address signal that is the same as the combined memory address signal that was used in the step of storing.

35. In an audio system including a memory comprising addressable defective memory cells and having a defective memory cell error rate less than or equal to a maximum allowable error rate Tmax, a method of storing audio data comprising the steps of:

generating a deterministic sequence of pseudo-random memory address bits;

generating a sequence of contiguous memory address bits;

concatenating the sequence of pseudo-random memory address bits with the sequence of contiguous memory address bits to form a combined memory address signal; and storing the audio data in the selected memory device as addressed by the combined memory address signal.

36. A method as recited in claim 35, further comprising the steps of:

retrieving the audio data stored in the selected memory device using another combined memory address signal that is the same as the combined memory address signal that was used in the step of storing; and processing the retrieved audio data in the audio system.

* * * * *